United States Patent [19]

Ireland

[11] 4,446,436

[45] May 1, 1984

[54] CIRCUIT FOR GENERATING ANALOG SIGNALS

[75] Inventor: Jeffrey R. Ireland, Dallas, Tex.

[73] Assignee: Mostek Corporation, Carrollton, Tex.

[21] Appl. No.: 278,906

[22] PCT Filed: May 18, 1981

[86] PCT No.: PCT/US81/00700

§ 371 Date: May 18, 1981

§ 102(e) Date: May 18, 1981

[87] PCT Pub. No.: WO82/04168

PCT Pub. Date: Nov. 25, 1982

[51] Int. Cl.³ .......................... H03K 4/02; H03K 6/00; H03K 13/02

[52] U.S. Cl. ........................ 328/14; 328/143; 328/186; 307/529; 307/260; 377/76; 340/347 DA

[58] Field of Search ................ 328/14, 142, 143, 186; 307/529, 260; 340/347 DA; 377/76

[56] References Cited

U.S. PATENT DOCUMENTS

| | | | |
|---|---|---|---|
| 3,626,076 | 12/1971 | Uchiyama | 328/14 |
| 3,641,442 | 2/1972 | Boucher | 328/14 |
| 3,657,657 | 4/1972 | Jefferson | 328/14 |
| 3,992,680 | 11/1976 | Herzel | 328/14 |
| 4,366,470 | 12/1982 | Takanashi et al. | 340/347 DA |

Primary Examiner—John S. Heyman

[57] ABSTRACT

A tone synthesizer circuit (10) includes a multi-tap resistor (86) which produces a plurality of discrete voltages at the taps (T1-T16). A switch (88-118) is provided for each of the taps (T1-T16). The tap switches (88-118) are organized into four groups. A second group of switches are organized into two groups with each of the second switch groups having a connection to one of the switches in each of the first groups. A third group of switches (164-170) are each connected to one of the group of the second switches (132-138). Circuitry responsive to a digital clock input signal produces a group of control signals on control lines (66-72) which are respectively connected to operate each of the four groups of the first switches (88-108). Further circuit means responsive to the digital input signal transmit control signals through control lines (74-76) to operate the second group of switches (132-138). Further circuitry is provided which operates in response to the digital input signal to produce control signals on control lines (78, 80) to operate third switches (164-170). The first, second and third switches are operated in such a manner that an output terminal (168) is sequentially connected to each of the taps (T1-T16) of the resistor (86). The tap connections are weighted and selected in such an order to produce a sinusoidal output signal at the output terminal (168).

6 Claims, 2 Drawing Figures

CIRCUIT FOR GENERATING ANALOG SIGNALS

TECHNICAL FIELD

The present invention pertains to digital-to-analog conversion circuitry and more particularly to the synthesis of sinusoidal signals.

BACKGROUND OF THE INVENTION

In DTMF (dual tone multifrequency) telephone signaling systems specified frequency sinusoidal signals must be generated when selected touch keys of the telephone are activated. The original and still widely used approach for generating these tones has been the use of conventional LC, discrete component, oscillators. However, oscillators of this type are bulky and expensive.

Integrated circuit tone dialing equipment has been developed in response to the demand for economical and low power devices. However, integrated circuit tone dialers have suffered from a number of serious drawbacks. These include the difficulty of working at the extremely low voltages which can be supplied to telephone receivers and the relative complexity and resulting high cost of tone synthesizing circuits. Conventional tone generation circuits utilize a large number of components which increases the size of the integrated circuit. This in turn increases the cost of the circuit. Therefore there exists a need for a tone synthesizing circuit which has a minimum number of circuit elements in order to reduce the area required for the integrated circuit.

SUMMARY OF THE INVENTION

A selected embodiment of the present invention comprises a circuit for generating an analog signal. This circuit receives power from first and second power terminals. The circuit includes a multi-tap resistor which is connected between the first and second power terminals to produce a plurality of discrete voltages. A plurality of first switches are connected respectively to the taps of the resistor. Circuitry is provided which is responsive to a digital input signal for generating a plurality of first control signals each controlling a separate group of the first switches. A plurality of second switches are provided with each connected to a plurality of the first switches wherein each of the second switches is connected to no more than one of the first switches within each of the groups of first switches. Further, each first switch is connected to no more than one of the second switches. Circuitry is provided which is responsive to the digital input signal for generating a plurality of second control signals each controlling a separate group of the second switches. A plurality of third switches are provided with each connected to a plurality of the second switches and to an output terminal wherein each of the third switches is connected to no more than one of the second switches within each of the groups of second switches. Each second switch is connected to no more than one of the third switches. Circuitry is provided which is responsive to the digital input signal for generating a plurality of third control signals for controlling the third switches wherein the operation of the third switches connects the taps one at a time to the output terminal to produce an analog signal at the output terminal. The analog signal can have any desired waveform depending upon the weighting and connection of the taps to the resistor. In a telephone application for producing DTMF signaling the taps are weighted and connected such that a sinusoidal type of analog output signal is produced.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
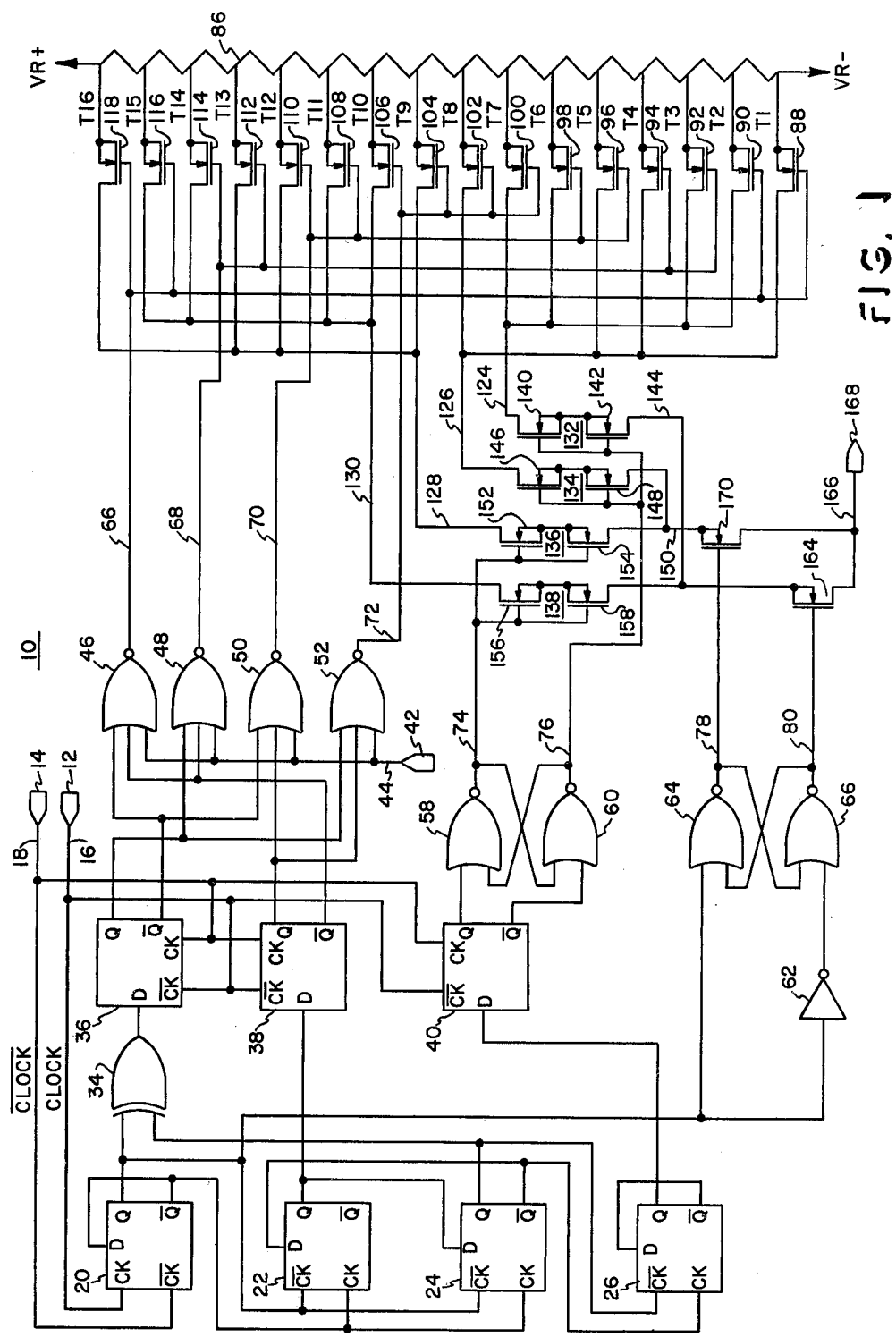
FIG. 1 is a schematic logic circuit illustrating the tone generating circuit of the present invention.

There is illustrated in FIG. 1 a tone synthesizing circuit which is designated generally by the reference numeral 10.

Circuit 10 includes input terminals 12 and 14 which receive respectively a digital clock signal and its complement. This clock signal preferably has a 50% duty cycle. The clock signal is transmitted through a line 16 and its complement is transmitted through a line 18.

Circuit 10 receives the clock signal input and produces therefrom a plurality of control signals for activating a series of switches. In the first step of the decoding process the clock signal and its complement are provided to a group of four flip-flop circuits 20, 22, 24 and 26. The lines 16 and 18 are connected respectively to the CK and $\overline{CK}$ inputs of flip-flop 20. The $\overline{Q}$ output of flip-flop 20 is connected to the D terminal thereof. The Q output of flip-flop 20 is transmitted to the first input of an exclusive OR gate 34.

The $\overline{Q}$ output of flip-flop 20 is connected to the CK inputs of flip-flops 22 and 24. The Q output of flip-flop 20 is connected to the $\overline{CK}$ inputs of flip-flops 22 and 24. The Q output of flip-flop 22 is connected to the D input of flip-flop 24.

The Q output of flip-flop 24 is connected to the second input of gate 34 and to the $\overline{CK}$ input of flip-flop 26. The $\overline{Q}$ output of flip-flop 24 is connected to the D input of flip-flop 22 and to the CK input of flip-flop 26. The $\overline{Q}$ output of flip-flop 26 is connected to the D input thereof.

The clock lines 16 and 18 are connected respectively to the $\overline{CK}$ and CK inputs of latches 36, 38 and 40. The output of gate 34 is connected to the D input of latch 36. The Q output of flip-flop 22 is connected to the D input of latch 38. The Q output of flip-flop 26 is connected to the D input of latch 40.

Circuit 10 includes a terminal 42 which receives a disable signal whenever a plurality of touch keys are depressed on a telephone keyboard at the same time. This disable signal is transmitted through a line 44 to one input of each of NOR gates 46, 48, 50 and 52.

The Q output of latch 36 is connected to input terminals of gates 48 and 52. The $\overline{Q}$ output of latch 36 is connected to input terminals of gates 46 and 50. The Q output of latch 38 is connected to input terminals of gates 50 and 52. The $\overline{Q}$ output of latch 38 is connected to input terminals of gates 46 and 48.

The Q output of latch 40 is connected to the first input of a NOR gate 58. The $\overline{Q}$ output of latch 40 is connected to the first input of a NOR gate 60. The output of gate 58 is connected to the second input of gate 60 and the output of gate 60 is connected to the second input of gate 58.

The Q output of flip-flop 20 is further connected to the input of an inverter 62 and to the first input of a NOR gate 64. The output of inverter 62 is connected at the first input of a NOR gate 66. The output of gate 64 is connected to the second input of gate 66 and the output of gate 66 is connected to the second input of gate 64.

The circuitry described thus far produces a plurality of control signals which are transmitted through lines 66, 68, 70, 72, 74, 76, 78 and 80 which are connected respectively to the outputs of gates 46, 48, 50, 52, 58, 60, 64 and 66.

The circuit 10 further includes a multi-tap resistor 86 which is connected between power terminals VR+ and VR−. The taps on the resistor 86 are selected for the preferred embodiment to produce a sinusoidal output waveform. However, it should be noted that the taps can be selected in such a manner to produce a waveform of almost any shape. The taps on resistor 86 are indicated by the reference numerals T1–T16.

For each of the taps on resistor 86 there is a corresponding FET switch which has the gate terminal connected to one of the control lines and the source and drain terminals connected between the resistor and an output line. Taps T1–T16 are connected respectively to switch transistors 88–118.

The transistors 88–118 are arranged into four groups. The first group comprises transistors 88, 90, 116 and 118. Control line 66 is connected to the gate terminals of these transistors. The second group comprises transistors 92, 94, 112 and 114. Control line 68 is connected to the gate terminals of these transistors. The third group comprises transistors 96, 98, 108 and 110. Control line 70 is connected to the gate terminals of these transistors. The fourth group comprises transistors 100, 102, 104 and 106. Control line 72 is connected to the gate terminals of these transistors.

Circuit 10 includes four lines 124, 126, 128 and 130 which are connected to the transistors 88–118. In particular, the line 124 is connected to the output of transistors 90, 92, 98 and 100. Line 126 is connected to the outputs of transistors 88, 94, 96 and 102. Line 128 is connected to the outputs of transistors 104, 110, 112 and 118. Line 130 is connected to the outputs of transistors 106, 108, 114 and 116. Note that each of the output lines 124, 126, 128 and 130 is connected to one switch transistor in each of the groups of transistors 88–118.

Lines 124, 126, 128 and 130 are connected respectively to switch circuits 132, 134, 136 and 138. Switch circuits 132, 134, 136 and 138 are divided into two groups each group having a common output terminal.

Switch circuit 132 comprises transistors 140 and 142 wherein the gate and drain terminals thereof are connected serially between line 124 and a line 144. The gate terminals of transistors 140 and 142 are connected to the control line 76 from gate 60.

The switch circuit 134 comprises transistors 146 and 148 which have the drain and source terminals connected serially together between line 126 and a line 150. The gate terminals of transistors 146 and 148 are connected to line 76.

Switch circuit 136 comprises transistors 152 and 154 which have the drain and source terminals thereof connected serially between lines 128 and 150. The gate terminals of transistors 152 and 154 are connected to line 74.

Switch circuit 138 comprises transistors 156 and 158 which have the source and drain terminals thereof connected serially between line 130 and line 144. The gate terminals of transistors 156 and 158 are connected to line 74.

A switch transistor 164 has the source and drain terminals thereof connected between line 144 and an output line 166. Line 166 is connected to an output terminal 168. The gate terminal of transistor 164 is connected to line 80.

A switch transistor 170 has the source and drain terminals thereof connected between line 150 and the output line 166 with the gate terminal thereof connected to line 78.

Figure 2:
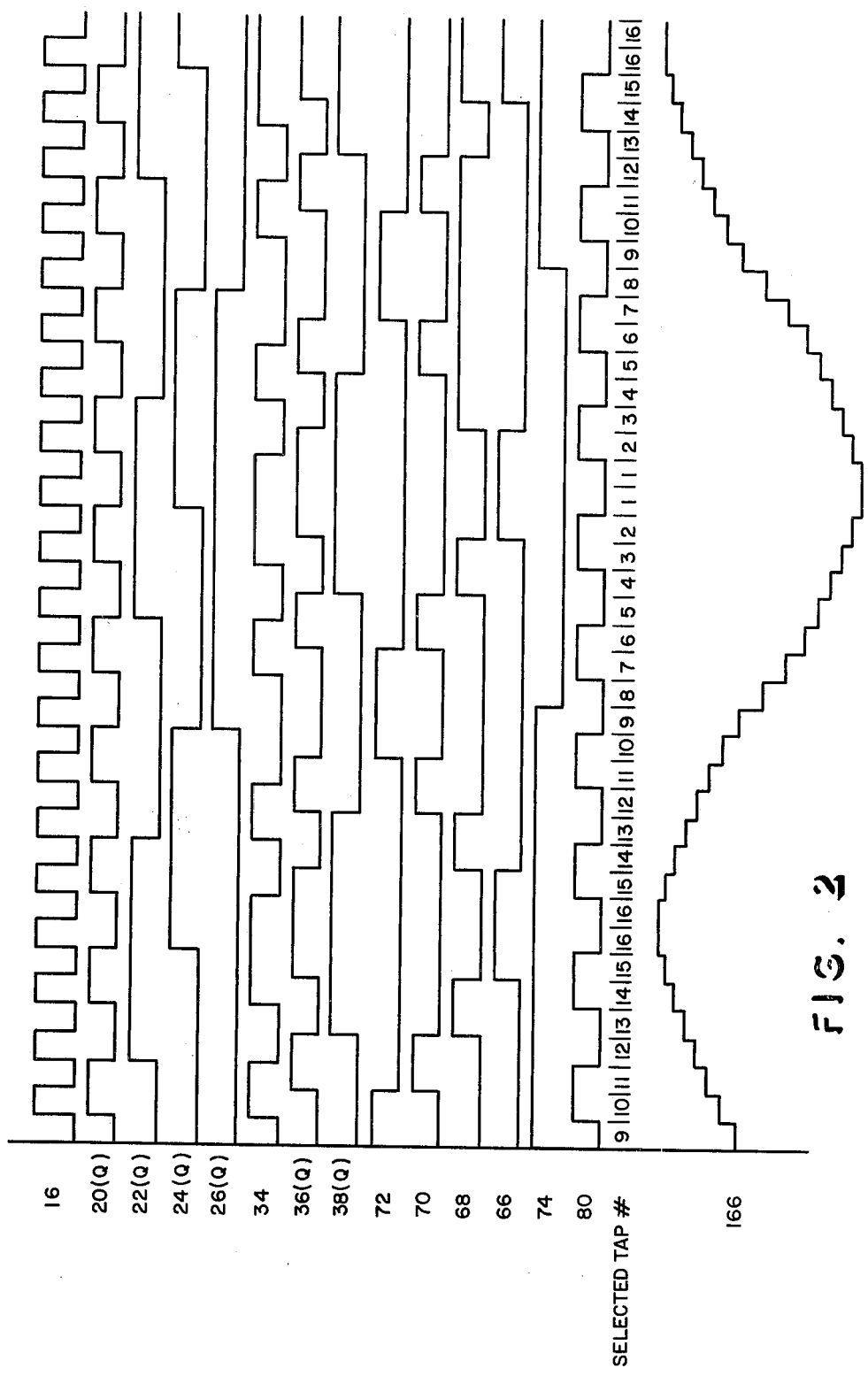
FIG. 2 is an illustration of selected waveforms which occur in the circuit illustrated in FIG. 1.

Referring now to FIG. 2 there are illustrated various representative waveforms which occur in the circuit shown in FIG. 1. These waveforms are designated by the line through which the waveform passes or by the output terminal and circuit element which produces the signal.

The operation of the circuit of the present invention is now described in reference to FIGS. 1 and 2. A typical application of circuit 10 is in a telephone tone dialing system. The terminals 12 and 14 are connected to circuitry (not shown) which generates selected frequency clock signals in response to the closing of key contacts on a telephone keyboard. When a clock signal is input at these terminals the circuit 10 synthesizes a sinusoidal type signal which is transmitted through line 166 to output terminal 168. The output signal is at a frequency which is one-sixteenth of the frequency of the input clock signal.

The input clock signal is decoded to produce control signals for activating switches which connect the taps of resistor 86 to the output terminal 168. The control signals activate the switches in such a manner that only one tap is connected at any one time and the taps are sequentially selected in a fashion to generate a waveform which approximates a sinusoid. This waveform is illustrated for line 166 in FIG. 2. The taps on resistor 86 are weighted in such a manner to produce the sinusoid type waveform. As noted above the taps and switch connections could be easily altered to produce other types of waveforms.

The input clock signal together with its complement are provided to a group of flip-flops 20, 22, 24 and 26 together with the exclusive OR gate 34 to produce the control signals shown in FIG. 2 corresponding to these circuit elements.

The outputs from the exclusive OR gate 34 and the Q outputs of flip-flops 22 and 26 are provided to a group of three latches 36, 38 and 40. The output signals of the latches 36 and 38 are illustrated in FIG. 2.

The NOR gates 46, 48, 50 and 52 receive the outputs of the latch circuits 36 and 38 together with a disable signal which is received through terminal 42. The output signals of the NOR gates 66, 68, 70 and 72 are illustrated in FIG. 2. Each of these signals controls four of the switches which are connected to the taps of resistor 86. The switch transistors 88–118 are arranged in four groups with each group receiving one of the control signals through lines 66–72. Thus whenever one of the control signals on line 66–72 goes to a high state there will be four of the transistors 88–118 turned on.

The latch 40 generates control signals which are transmitted through the NOR gates 58 and 60. The NOR gates 58 and 60 drive the control signals on line 74 and 76 such that these signals are accurate complements of each other to eliminate the possibility that two switches could be activated simultaneously and cause a short for the resistor 86. The control signal on line 74 is illustrated in FIG. 2. The control signal on line 76 is the complement of the signal on line 74.

The signal on line 74 turns on and off the switches 136 and 138 to route the signals received on lines 128 and 130. The control signal on line 76 turns on and off the switches 132 and 134 to route the signals received on line 124 and 126.

Note that the switches 132, 134, 136 and 138 comprise serial transistors having a common gate connection. This configuration is provided to ensure that there is not a sufficient voltage drop across either of the transistors to cause the formation of a bipolar transistor in the well and substrate in which the transistors of the switch are fabricated.

The Q output of flip-flop 20 is transmitted through inverter 62 to produce the complement thereof. These two signals are then input to NOR gates 64 and 66 to produce control signals on lines 78 and 80. Like the NOR gates 58 and 60 described above, the NOR gates 64 and 66 ensure that the signals on lines 78 and 80 are accurate complements of each other so that two switches will not be turned on simultaneously. The control signal on line 78 selectively turns on and off the transistor 170. Likewise the control signal on line 80 turns on and off the transistor 164. These control signals are timed to operate such that the correct sampling of the analog signals from the taps of resistors 86 are carried out to produce the sinusoidal type output signal on line 166.

In summary, the present invention provides a circuit for generating a synthesized waveform in response to a digital clock signal input. The circuit includes a minimal number of components to reduce the cost and complexity of manufacturing the circuit in integrated circuit form.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

I claim:

1. A circuit for producing an analog signal, comprising:
   first and second power terminals;
   a multi-tap resistor connected between said first and second power terminals;
   a plurality of first switches formed into plural groups connected respectively to the taps of said resistor;
   means responsive to a digital input signal for generating a plurality of first control signals each controlling a separate group of said first switches;
   a plurality of second switches each connected to a plurality of said first switches wherein each second switch is connected to no more than one of said first switches within each of said groups of first switches, and each first switch is connected to no more than one of said second switches;
   means responsive to said digital input signal for generating a plurality of second control signals each controlling a separate group of said second switches;
   a plurality of third switches each connected to a plurality of said second switches and to an output terminal wherein each third switch is connected to no more than one of said second switches within each of said groups of second switches and each second switch is connected to no more than one of said third switches; and
   means responsive to said digital input signal for generating a plurality of third control signals for controlling said third switches wherein the operation of said third switches connects said taps one at a time to said output terminal to produce said analog signal of said output terminal.

2. The circuit recited in claim 1 wherein said taps are selected on said resistor to produce voltage steps weighted such that said analog signal is a sinusoid.

3. The circuit recited in claim 1 wherein there are sixteen of said taps, sixteen of said first switches organized in four groups, four of said first control signals, four of said second switches organized in two groups, two of said second control signals, two of said third switches and two of said third control signals.

4. The circuit recited in claim 1 including means for driving said first control signals to the off state thereof in response to a disable signal.

5. A circuit for producing an analog signal in response to a digital clock signal, comprising:
   a first flip-flop circuit connected to receive said clock signal and the inverse clock signal thereof at the clock and $\overline{\text{clock}}$ inputs respectively of said first flip-flop circuit and the $\overline{\text{Q}}$ output thereof connected to the D input thereof;
   a second flip-flop circuit having the clock input thereof and the $\overline{\text{clock}}$ input thereof connected respectively to the $\overline{\text{Q}}$ output and the Q output of said first flip-flop circuit;
   a third flip-flop circuit having the clock and $\overline{\text{clock}}$ inputs thereof connected respectively to the $\overline{\text{Q}}$ and Q outputs of said first flip-flop circuit, the $\overline{\text{Q}}$ output and D input thereof connected respectively to the D input and Q output of said second flip-flop;
   a fourth flip-flop circuit having the clock and $\overline{\text{clock}}$ inputs thereof connected respectively to the $\overline{\text{Q}}$ and Q outputs of said third flip-flop circuit and the D input and $\overline{\text{Q}}$ output thereof connected together;
   an exclusive-OR gate having the first input thereof connected to the Q output of said first flip-flop circuit and the second input thereof connected to the Q output of said third flip-flop circuit;
   a first latch circuit having the D input thereof connected to the output of said exclusive-OR gate, the clock and $\overline{\text{clock}}$ inputs thereof connected to receive respectively said inverse clock and said clock signals;
   a second latch having the D input thereof connected to the Q output of said second flip-flop, the clock and $\overline{\text{clock}}$ inputs thereof connected to receive respectively said inverse clock and said clock signals;
   a third latch having the D input thereof connected to the Q output of said fourth flip-flop, the clock and $\overline{\text{clock}}$ inputs thereof connected to receive respectively said inverse clock and said clock signals;
   a first NOR gate having the first input thereof connected to the $\overline{\text{Q}}$ output of said first latch, the second input thereof connected to the $\overline{\text{Q}}$ output of said second latch and the third input thereof connected to receive a disable signal;
   a second NOR gate having the first input thereof connected to the Q output of said first latch, the second input thereof connected to the $\overline{\text{Q}}$ output of said second latch and the third input thereof connected to receive said disable signal;

a third NOR gate having the first input thereof connected to the $\overline{Q}$ output of said first latch, the second input thereof connected to the Q output of said second latch and the third input thereof connected to receive said disable signal;

a fourth NOR gate having the first input thereof connected to the Q output of said first latch, the second input thereof connected to the Q output of said second latch and the third input thereof connected to receive said disable signal;

a fifth NOR gate having the first input thereof connected to the Q output of said third latch;

a sixth NOR gate having the first input thereof connected to the output of said fifth NOR gate, the second input thereof connected to the $\overline{Q}$ output of said third latch and the output thereof connected to the second input of said fifth NOR gate;

an inverter having the input thereof connected to the Q output of said first flip-flop circuit;

a seventh NOR gate having the first input thereof connected to the Q output of said first flip-flop circuit;

an eighth NOR gate having the first input thereof connected to the output of said seventh NOR gate, the second input thereof connected to the output of said inverter and the output thereof connected to the second input of said seventh NOR gate;

a resistor connected between first and second power terminals and having sixteen taps;

sixteen first switches connected respectively to said sixteen taps, each first switch having a control terminal, said first switches divided into first, second, third and fourth groups, each group having four of said first switches therein, the control terminals of said first switches in said first, second, third and fourth groups connected respectively to the outputs of said first, second, third and fourth NOR gates;

four second switches each connected to one of said first switches in each of said first, second, third and fourth groups, each of said second switches having a control terminal with the control terminals for a first two of said switches connected to the output of said fifth NOR gate and the control terminals for the remaining two of said first switches connected to the output of said sixth NOR gate;

two third switches each connected to two of said second switches, each third switch having a control terminal, a first of said third switches having the control terminal thereof connected to the output of said seventh NOR gate and a second of said third switches having the control terminal thereof connected to the output of said eighth NOR gate; and an output terminal connected to both of said third switches.

6. A method for generating an analog signal in response to a digital input signal, comprising the steps of:

generating a plurality of discrete voltage signals;

generating a plurality of first command signals in response to said digital input signal;

selectively routing a group of said discrete voltage signals through a set of first switches in response to said first command signals which operate said first switches;

generating a plurality of second command signals in response to said digital input signal;

selectively routing a subgroup of said discrete voltage signals, where said subgroup at discrete voltage signals is derived from said group of discrete voltage signals, through a set of second switches in response to said second command signals which operate said second switches;

generating a plurality of third control signals in response to said digital input signal;

selectively routing a one of said discrete voltage signals where said one of said discrete voltage signals is derived from said subgroup of discrete voltage signals, through a set of third switches to an output terminal in response to said third control signals which operate said third switches; and repeating the above steps to produce an analog output signal which comprises a series of said discrete voltage signals.

* * * * *